United States Patent
Pan et al.

(10) Patent No.: US 9,558,982 B2
(45) Date of Patent: Jan. 31, 2017

(54) MINIMAL CONTACT EDGE RING FOR RAPID THERMAL PROCESSING

(71) Applicant: Applied Materials, Inc., Santa Clara, CA (US)

(72) Inventors: Heng Pan, Santa Clara, CA (US); Sairaju Tallavarjula, Santa Clara, CA (US); Kevin J. Bautista, San Jose, CA (US); Jeffrey Tobin, Mountain View, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 117 days.

(21) Appl. No.: 14/030,728

(22) Filed: Sep. 18, 2013

(65) Prior Publication Data

US 2014/0113458 A1    Apr. 24, 2014

Related U.S. Application Data

(60) Provisional application No. 61/718,090, filed on Oct. 24, 2012.

(51) Int. Cl.
| | |
|---|---|
| *H01L 21/683* | (2006.01) |
| *H01L 21/687* | (2006.01) |
| *H01L 21/67* | (2006.01) |

(52) U.S. Cl.
CPC ..... *H01L 21/6835* (2013.01); *H01L 21/67115* (2013.01); *H01L 21/67248* (2013.01); *H01L 21/68735* (2013.01)

(58) Field of Classification Search
CPC .................. H01L 21/6835; H01L 21/68735
See application file for complete search history.

(56) References Cited

U.S. PATENT DOCUMENTS

| | | | |
|---|---|---|---|
| 5,848,889 | A | 12/1998 | Tietz et al. |
| 5,879,128 | A | 3/1999 | Tietz et al. |
| 5,960,555 | A | 10/1999 | Deaton et al. |

(Continued)

FOREIGN PATENT DOCUMENTS

| | | |
|---|---|---|
| JP | 2003-059852 A | 2/2003 |
| JP | 2006-093283 A | 4/2006 |
| JP | 2009-016567 A | 1/2009 |

OTHER PUBLICATIONS

International Search Report dated Jan. 16, 2014 for PCT/US2013/060002.

*Primary Examiner* — Caleb Henry
*Assistant Examiner* — Mounir Amer
(74) *Attorney, Agent, or Firm* — Patterson & Sheridan, LLP

(57) ABSTRACT

Embodiments of the disclosure generally relate to a support ring that supports a substrate in a process chamber. In one embodiment, the support ring comprises an inner ring, an outer ring connecting to an outer perimeter of the inner ring through a flat portion, an edge lip extending radially inwardly from an inner perimeter of the inner ring to form a supporting ledge, and a substrate support extending upwardly from a top surface of the edge lip. The substrate support may be a continuous ring-shaped body disposed around a circumference of the edge lip. The substrate support supports a substrate about its entire periphery from the back side with minimized contact surface to thermally disconnect the substrate from the edge lip. Particularly, the substrate support provides a substantial line contact with the back surface of the substrate.

15 Claims, 3 Drawing Sheets

(56) References Cited

U.S. PATENT DOCUMENTS

| | | | |
|---|---|---|---|
| 6,133,152 A | 10/2000 | Bierman et al. | |
| 6,200,388 B1 * | 3/2001 | Jennings | 118/728 |
| 6,264,467 B1 | 7/2001 | Lue et al. | |
| 6,280,183 B1 * | 8/2001 | Mayur et al. | 432/258 |
| 6,395,363 B1 | 5/2002 | Ballance et al. | |
| 6,454,865 B1 | 9/2002 | Goodman et al. | |
| 6,494,955 B1 | 12/2002 | Lei et al. | |
| 6,888,104 B1 | 5/2005 | Ranish et al. | |
| 7,127,367 B2 | 10/2006 | Ramachandran et al. | |
| 7,256,375 B2 | 8/2007 | Oosterlaken | |
| 7,414,224 B2 | 8/2008 | Aderhold et al. | |
| 7,648,579 B2 | 1/2010 | Goodman et al. | |
| 7,704,327 B2 | 4/2010 | Waldhauer et al. | |
| 8,287,650 B2 | 10/2012 | Lee et al. | |
| 2007/0104470 A1 | 5/2007 | Aderhold et al. | |
| 2008/0064184 A1 * | 3/2008 | Lackner et al. | 438/459 |
| 2008/0085591 A1 * | 4/2008 | Gomez et al. | 438/585 |
| 2008/0141942 A1 * | 6/2008 | Brown et al. | 118/723 R |
| 2009/0255921 A1 | 10/2009 | Ranish et al. | |
| 2009/0274454 A1 | 11/2009 | Aderhold et al. | |
| 2010/0044974 A1 | 2/2010 | Kenworthy et al. | |
| 2011/0159211 A1 | 6/2011 | Du Bois et al. | |
| 2011/0250764 A1 | 10/2011 | Yokota et al. | |
| 2012/0213500 A1 | 8/2012 | Koelmel et al. | |

\* cited by examiner

MINIMAL CONTACT EDGE RING FOR RAPID THERMAL PROCESSING

CROSS-REFERENCE TO RELATED APPLICATIONS

This application claims benefit of U.S. provisional patent application Ser. No. 61/718,090, filed Oct. 24, 2012, which is herein incorporated by reference.

BACKGROUND

Field

Embodiments of the disclosure generally relate to a support ring to support a substrate in a process chamber.

Description of the Related Art

In the processing of substrates, such as semiconducting substrates, the substrate is placed on a support in a process chamber and suitable processing conditions are maintained in the process chamber. For example, the substrate can be heated in a controlled heating cycle to thermally process the substrate. The substrate can be heated, for example, by an array of heating lamps disposed above and/or below the substrate in the chamber. Thermal processing can be used, for example, to anneal a layer that has been ion-implanted on the substrate, perform thermal oxidation or nitridation processes, or perform thermal chemical vapor deposition processes on the substrate.

It has been observed that variations in temperature gradients across the substrate can result in non-uniform processing of the substrate. Non-uniform temperatures occur at different substrate regions due to non-uniform convection or conduction heat losses from regions of the substrate in contact with the support (or other chamber components) and substrate regions not in contact with the support. The temperature gradients in the substrate can be reduced using a substrate support ring that extends inwardly from the chamber wall and surround a periphery of the substrate. Specifically, the substrate to be thermally processed is supported on its periphery by an edge of the support ring having an annular lip contacting the edge of the substrate. The support ring effectively expands or pushes out the temperature gradients in the substrate from the substrate periphery to the outer edges of the support ring. The overlapping of the substrate and the support ring also prevents or minimizes the leakage of the high-temperature radiant energy from the radiant heat source (typically disposed above the substrate) around the edge of the support ring on either its inner or outer side.

Support rings having an annular edge can fail to provide adequate temperature uniformity across the substrate in rapid heating rate processes, for example, processes having heating rates of at least about 200° C./second in a rapid thermal processing (RTP) system. In these processes, the difference in heating rates between the support ring and the substrate generates temperature gradients along the periphery of the substrate become unacceptably high during the heating process step. The substrate may also experience temperature variations caused by azimuthal variations in solid-solid thermal contact, largely by virtue of variable surface finish and planarity/flatness between the substrate and the support ring. In certain situations, since the substrate and the annular lip of the support ring overlap near the edge of the substrate, it is difficult to achieve uniform temperature profile near the edge by measuring and adjusting the temperature of the substrate alone. It is particularly difficult to achieve temperature uniformity across the substrate especially when the substrate is heated at reduced pressure (e.g., 3 Torr). This is because the contact resistance at the overlapping area between the substrate and the support ring is much larger at lower pressure (since flow through the intimate contact points is dominant), causing the temperature profile at edge of the substrate to be significantly higher than that at the central area.

Accordingly, it is desirable to have an improved support ring that prevents or minimizes thermal coupling between the substrate and the support ring so that the support ring does not generate excessive temperature gradients in a substrate during thermal processing.

SUMMARY

Embodiments of the disclosure generally relate to a support ring to support a substrate during thermal processing in a process chamber. The substrate to be thermally processed is supported on its periphery by an edge lip of the support ring. The support ring may extend radially inwardly along the inner circumferential surfaces of the process chamber and surrounds a periphery of the substrate. The support ring has an edge lip extends radially inwardly from a surface of the support ring. In one embodiment, the edge lip is provided with a continuous ring-like substrate support disposed along the edge lip, i.e., running around the circumference of the edge lip. The edge lip extends from a top surface of the edge lip. The substrate support supports the substrate about its entire periphery from the back side with minimized contact surface to thermally disconnect the substrate from the edge lip. The substrate support provides a substantial line contact with the back surface of the substrate. In one example, the substrate support has a hemispherical top surface to reduce the contact area available for conductive transfer of heat between the edge lip of the support ring and the substrate, resulting in an improved temperature profile across the substrate with a minimum edge temperature gradient.

In one embodiment, a substrate support ring is provided. The substrate support ring comprises a ring body, an edge lip extending radially inwardly from a surface of the ring body, and a substrate support extending upwardly from a top surface of the edge lip, wherein the substrate support is a continuous ring-shaped body.

In another embodiment, the support ring comprises an inner ring, an outer ring connecting to an outer perimeter of the inner ring through a flat portion, and an edge lip extending radially inwardly from an inner perimeter of the inner ring to form a supporting ledge. The supporting ring comprises a substrate support extending upwardly from a top surface of the edge lip, and the substrate support is a continuous ring-shaped body disposed within the vicinity of the edge of the edge lip. The substrate support supports a substrate about its entire periphery from the back side with minimized contact surface to thermally disconnect the substrate from the edge lip. Particularly, the substrate support provides a substantial line contact with the back surface of the substrate.

In yet another embodiment, a method of processing a substrate in a thermal processing chamber is provided. The method includes providing a substrate support ring having a ring body and an edge lip extending radially inwardly from a surface of the ring body, and supporting a back surface of a substrate near a peripheral edge of the substrate by a substrate support disposed around a circumference of the edge lip, wherein the substrate support is configured to minimize thermal coupling between the substrate and the support ring by making a line contact with the back surface of the substrate.

BRIEF DESCRIPTION OF THE DRAWINGS

So that the manner in which the above recited features of the disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Exemplary Rapid Thermal Processing Chamber

Figure 1:
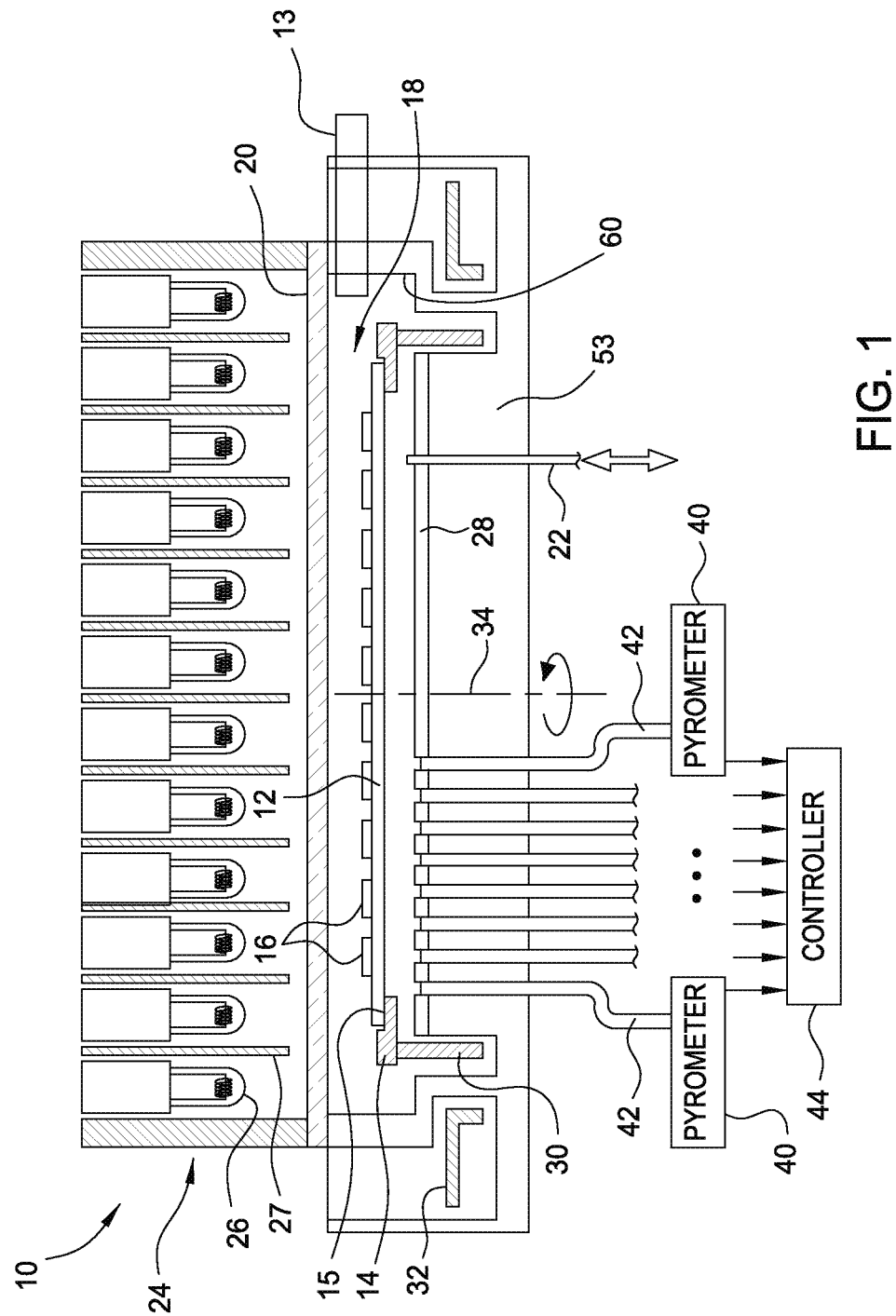
FIG. 1 schematically illustrates an exemplary rapid thermal processing chamber having a substrate support ring.

FIG. 1 schematically represents a rapid thermal processing chamber 10. A substrate 12, for example, a semiconductor substrate such as a silicon substrate to be thermally processed is passed through the valve or access port 13 into the process area 18 of the processing chamber 10. The substrate 12 is supported on its periphery by an annular support ring 14. An edge lip 15 extends inward of the annular support ring 14 and contacts the peripheral edge of the substrate 12. The substrate may be oriented such that processed features 16 already formed in a front surface of the substrate 12 face upwardly toward a process area 18 defined on its upper side by a transparent quartz window 20. That is, the front surface of the substrate 12 is facing toward the array of lamps 26. In some embodiments, the front surface of the substrate 12 with the processed featured formed thereon may face away from the array of lamps 26, i.e., facing towards the pyrometers 40. Contrary to the schematic illustration, the features 16 for the most part do not project substantial distances beyond the front surface of the substrate 12 but constitute patterning within and near the plane of the front surface.

A plurality of lift pins 22, such as three lift pins, may be raised and lowered to support the back side of the substrate 12 when the substrate is handed between a paddle or robot blade (not shown) bringing the substrate into the processing chamber and onto the support ring 14. A radiant heating apparatus 24 is positioned above the window 20 and configured to direct radiant energy toward the substrate 12 through the window 20. In the processing chamber 10, the radiant heating apparatus may include a large number, 409 being an exemplary number, of high-intensity tungsten-halogen lamps 26 positioned in respective reflective tubes 27 arranged in a hexagonal close-packed array above the window 20. The array of lamps 26 is sometimes referred to as the lamphead. However, it is contemplated that other radiant heating apparatus may be substituted. Generally, these involve resistive heating to quickly ramp up the temperature of the radiant source. Examples of suitable lamps include mercury vapor lamps having an envelope of glass or silica surrounding a filament and flash lamps which comprise an envelope of glass or silica surrounding a gas such as xenon, which provides a heat source when the gas is energized. As used herein, the term lamp is intended to cover lamps including an envelope that surrounds a heat source. The "heat source" of a lamp refers to a material or element that can increase the temperature of the substrate, for example, a filament or gas that can be energized, or a solid region of a material that emits radiation such as a LED or solid state lasers and laser diodes.

As used herein, rapid thermal processing or RTP refers to an apparatus or a process capable of uniformly heating a substrate at rates of about 50° C./second and higher, for example, at rates of about 100° C./second to 150° C./second, and about 200° C./second to 400° C./second. Typical ramp-down (cooling) rates in RTP chambers are in the range of about 80° C./second to 150° C./second. Some processes performed in RTF chambers require variations in temperature across the substrate of less than a few degrees Celsius. Thus, an RTP chamber must include a lamp or other suitable heating system and heating system control capable of heating at rate of up to about 100° C./second to 150° C./second, and about 200° C./second to 400° C./second, distinguishing rapid thermal processing chambers from other types of thermal chambers that do not have a heating system and heating control system capable of rapidly heating at these rates. An RTP chamber with such a heating control system may anneal a sample in less than 5 seconds, for example, less than 1 second, and in some embodiments, milliseconds.

It is important to control the temperature across the substrate 12 to a closely defined temperature uniform across the substrate 12. One passive means of improving the uniformity may include a reflector 28 disposed beneath the substrate 12. The reflector 28 extends parallel to and over an area greater than the substrate 12. The reflector 28 efficiently reflects heat radiation emitted from the substrate 12 back toward the substrate 12 to enhance the apparent emissivity of the substrate 12. The spacing between the substrate 12 and the reflector 28 may be between about 3 mm to 9 mm, and the aspect ratio of the width to the thickness of the cavity is advantageously greater than 20. The top of reflector 28, which may be made of aluminum and has a highly reflective surface coating or multi-layer dielectric interference mirror, and the back side of the substrate 12 form a reflecting cavity for enhancing the effective emissivity of the substrate, thereby improving the accuracy of temperature measurement. In certain embodiments, the reflector 28 may have a more irregular surface or have a black or other colored surface to more closely resemble a black-body wall. The reflector 28 may be deposited on a second wall 53, which is a water-cooled base 53 made of metal to heat sink excess radiation from the substrate, especially during cool down. Accordingly, the process area of the processing chamber 10 has at least two substantially parallel walls, of which a first is a window 20, made of a material being transparent to radiation such as quartz, and the second wall 53 which is substantially parallel to the first wall and made of metal significantly not transparent.

One way of improving the uniformity includes supporting the support ring 14 on a rotatable cylinder 30 that is magnetically coupled to a rotatable flange 32 positioned outside the processing chamber 10. A motor (not shown) rotates the flange 32 and hence rotates the substrate about its center 34, which is also the centerline of the generally symmetric chamber. Alternatively, the bottom of the rotatable cylinder 30 may be magnetically levitated cylinder held in place by magnets disposed in the rotatable flange 32 and rotated by rotating magnetic field in the rotatable flange 32 from coils in the rotatable flange 32.

Another way of improving the uniformity divides the lamps 26 into zones arranged generally ring-like about the central axis 34. Control circuitry varies the voltage delivered to the lamps 26 in the different zones to thereby tailor the radial distribution of radiant energy. Dynamic control of the zoned heating is affected by, one or a plurality of pyrometers 40 coupled through one or more optical light pipes 42 positioned to face the back side of the substrate 12 through apertures in the reflector 28 to measure the temperature across a radius of the rotating substrate 12. The light pipes 42 may be formed of various structures including sapphire, metal, and silica fiber. A computerized controller 44 receives the outputs of the pyrometers 40 and accordingly controls the voltages supplied to the different rings of lamps 26 to thereby dynamically control the radiant heating intensity and pattern during the processing. Pyrometers generally measure light intensity in a narrow wavelength bandwidth of, for example, 40 nm in a range between about 700 nm to 1000 nm. The controller 44 or other instrumentation converts the light intensity to a temperature through the well-known Planck distribution of the spectral distribution of light intensity radiating from a black-body held at that temperature. Pyrometry, however, is affected by the emissivity of the portion of the substrate 12 being scanned. Emissivity $\epsilon$ can vary between 1 for a black body to 0 for a perfect reflector and thus is an inverse measure of the reflectivity $R=1-\epsilon$ of the substrate back side. While the back surface of a substrate is typically uniform so that uniform emissivity is expected, the backside composition may vary depending upon prior processing. The pyrometry can be improved by further including a emissometer to optically probe the substrate to measure the emissivity or reflectance of the portion of the substrate it is facing in the relevant wavelength range and the control algorithm within the controller 44 to include the measured emissivity.

Exemplary Support Ring

Figure 2A:
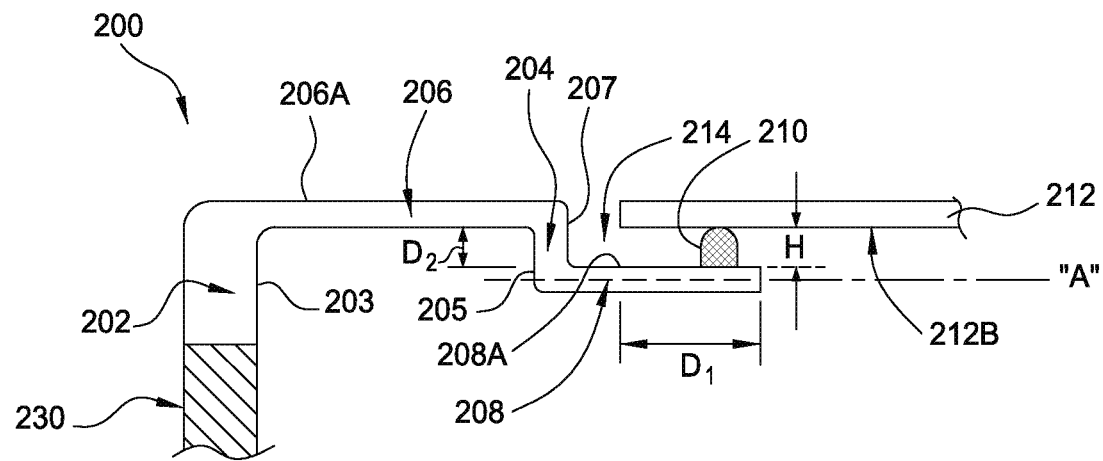
FIG. 2A schematically illustrates a cross-sectional side view of a support ring with a continuous ring-like substrate support that may be used in place of the substrate support ring of FIG. 1 according to one embodiment.

FIG. 2A is a schematic cross-sectional side view of a support ring 200 that may be used in place of the support ring 14 of FIG. 1 according to one embodiment. The support ring 200 illustrated in FIG. 2A may be disposed within a processing chamber, for example a rapid thermal processing chamber 10 shown in FIG. 1, and extend radially inwardly along the inner circumferential surfaces 60 of the processing chamber 10, The support ring may be a continuous ring body (or may be discrete ring-like bodies in some embodiments) which substantially surrounds a periphery of the substrate. As will be discussed below in greater detail, the support ring surrounds an edge lip which has a ring-shaped substrate support to make a line contact with the back surface of the substrate. In some embodiments, the edge lip may have a radial width varying along the circumference of the support ring in order to control bending of the edge lip during the heating process. It should be noted that the substrate 212 is shown with a square edge for illustrative purpose only since the substrate 212 may have a rounded edge.

Figure 2B:
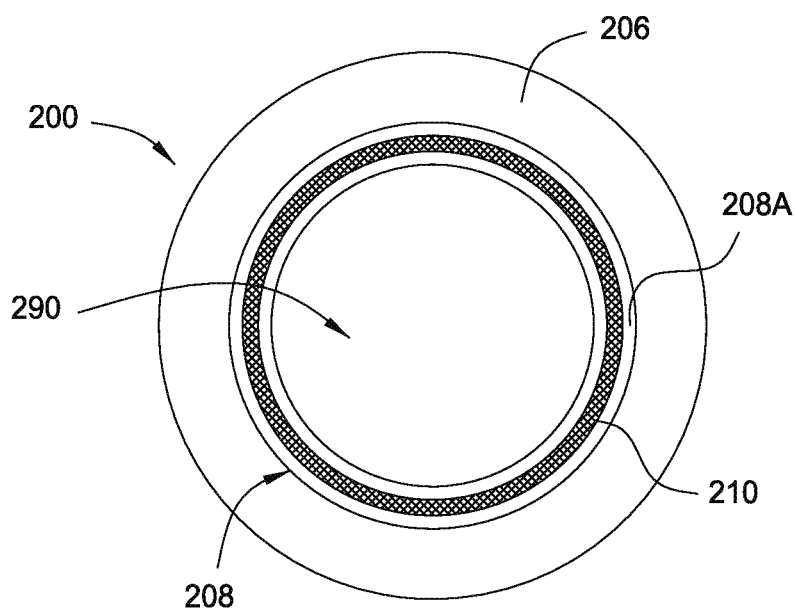
FIG. 2B schematically illustrates a top, partial view of the edge lip of FIG. 2A.

In one embodiment shown in FIG. 2A, the support ring 200 generally includes an annular body having a central opening 290 (FIG. 2B). The support ring 200 has an outer ring 202 and an inner ring 204. The outer ring 202 connects to the inner ring 204 through a flat portion 206 which extends radially inwardly from an inner perimeter 203 of the outer ring 202 to an outer perimeter 205 of the inner ring 204. The outer ring 202 may be supported by a cylinder 230, such as the rotatable cylinder 30 shown in FIG. 1. For a top-heating type configuration, the rotatable cylinder 230 may contact the support ring 200 just inward from the outer ring 202. That is, the bottom surface of the outer ring 202 is opposite to the top surface 206a of the flat portion 206 to prevent light leakage and provide required mechanical stability. The support ring 200 further includes an edge lip 208 which extends radially inwardly from an inner perimeter 207 of the inner ring 204 to form a supporting ledge to support the back surface 212b of the substrate 212 near a peripheral edge of the substrate 212.

The width of the edge lip 208 may vary according to the diameter of the substrate 212. The edge lip 208 may have a width of between about 15 mm to about 40 mm. The edge lip 208 may extend a sufficient distance beneath the substrate 212, creating a radial overlap area "$D_1$" ranging between about 0.5 mm and about 5.0 mm for a nominal 12 inch (300 mm) substrate. In some cases, the radial overlap area "$D_1$" may be extended to about 15 mm to about 30 mm, for example about 20 mm to about 25 mm for a 300 mm substrate. It is noted that the term "overlap" as used in this disclosure is measured as shown as $D_1$ in FIG. 2A. The edge lip 208 may be a continuous ring shape with a consistent radial width. Alternatively, the edge lip 208 may have a radial width varying along the circumference of the support ring to reduce the amount of material used to make the edge lip and to minimize or eliminate bending of the edge lip 208 during the heating process.

The top surface 208a of the edge lip 208 may be relatively below the top surface 206a of the flat portion 206 to form a recess 214 that is capable of holding the substrate 212 within the inner perimeter 207 of the inner ring 204. Specifically, the substrate is supported by the edge lip 208 through a substrate support 210 formed on the top surface 208a of the edge lip 208. The upper surface of the inner ring 204 may be at an elevation approximately the same as that of the upper surface 212a of the substrate 212. In one embodiment, the inner ring 204 may have a height "$D_2$" of about 0 mm to about 3 mm, for example, about 1 mm. The inner ring 204 may have a reduced height for reducing wafer edge temperature since it reduces the thermal coupling between the substrate 212 and the support ring 200. The substrate support 210 may be located within the overlap area "$D_1$" created between the back surface 212b substrate 212 and the edge lip 208. In other words, the substrate support 210 is disposed within the vicinity of the edge of the edge lip 208. The substrate support 210 extends upwardly and perpendicularly to a longitudinal axis "A" of the edge lip 208 from the top surface 208a of the edge lip 208. The substrate support 210 may have the same height "H" as the height "$D_2$" of the inner ring 204. In one embodiment, the substrate support 210 has a height "H" of about 0.5 mm to about 3 mm, for example about 0.7 mm.

Figure 2C:
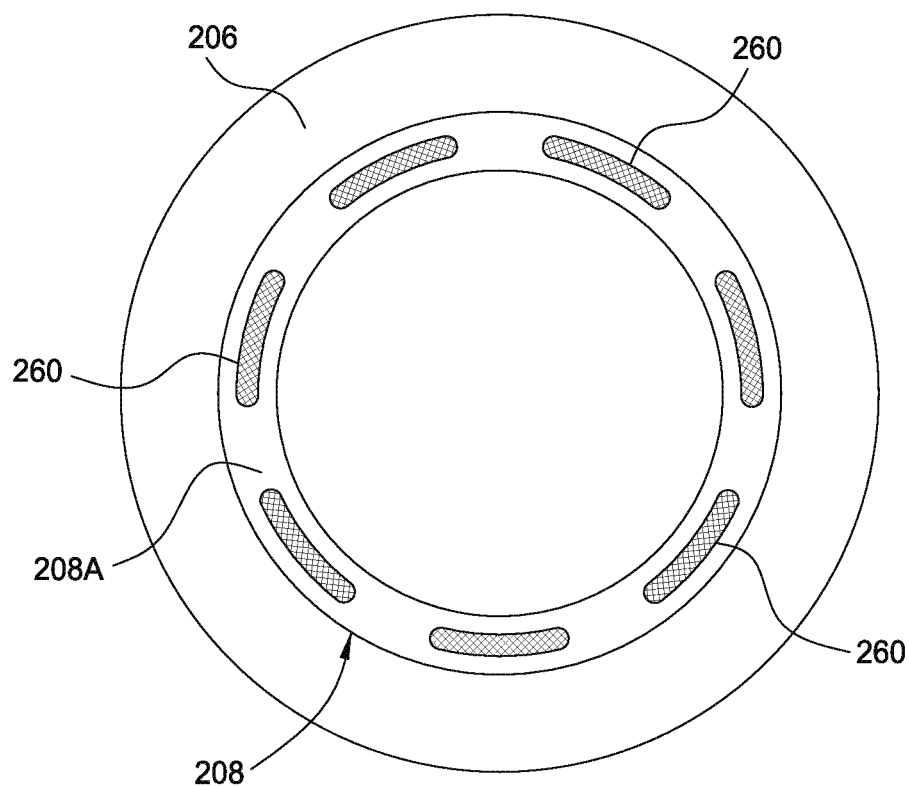
FIG. 2C schematically illustrates a top, partial view of the edge lip according to another embodiment.

The substrate support 210 may be a continuous ring body disposed around the circumference of the edge lip 208. An example of the ring body is shown in FIG. 2B, which schematically illustrates a top, partial view of the edge lip of FIG. 2A. The substrate support 210 is configured such that a portion of the substrate support 210 surrounds and partially over a periphery of a substrate (not shown in FIG. 2B). A substrate support 210 with a continuous ring body may be advantageous regardless of the configuration of the heating lamps since the continuous ring body prevents possible light leakage problem by blocking light of source radiation in the process chamber from reaching the pyrometer that is disposed opposing the source radiation. In addition, a continuous ring body is believed to provide a better and stable support for the substrate 212 since the substrate 212 is rotatably supported by the substrate support 210 during the heating process. It is contemplated that the substrate support may be formed of discrete or separated portions 260 distributed around the circumference of the edge lip 208 on the top surface 208a of the edge lip 208, creating a ring-like substrate support as shown in FIG. 2C. In such a case, the number of discrete portions 260 may range from 3 to 10, for example, 7 discrete portions 260, as shown in FIG. 2C. It is also contemplated that the number of discrete portions 260 may vary depending upon the dimension of the discrete portion 260 as well as the surface area of the edge lip 208.

In cases where discrete portions 260 are used, the radial overlap area should be sized to substantially block any possible light leakage from the lamphead to the pyrometer situated below the substrate. For example, the radial overlap area may be extended to about 15 mm to about 30 mm, for example about 20 mm to about 25 mm for a 300 mm substrate.

The substrate support 210 may be formed on the top surface 208a of the edge lip 208 using a laser machining technique or any suitable technique. The substrate support 210 may be any suitable shape such as rectangular, rhombus, square, hemispherical, hexagonal, triangular protrusions or mixtures of differently shaped protrusions. The substrate support 210 may be any shape having a reduced contact surface with the substrate. For example, the substrate support 210 may have a hemispherical top surface. Hemispherical top surface may be advantageous in terms of effective thermal mass reduction since the hemispherical top surface is able to further reduce the surface contact area between the edge lip and the substrate by turning the surface contact into a continuous line contact (FIG. 2B) or discrete line contacts (FIG. 2C).

In this disclosure, the "line contact" may refer to a line with a radial width less than about 500 µm, for example, between about 5 µm and about 200 µm, such as 50 µm. The substrate support 210 supports the substrate with minimal contact area and minimal heat transfer between the edge lip 208 and the substrate 212. For a nominal 12 inch (300 mm) substrate, the edge lip 208 to substrate area of contact may be less than about 15 cm$^2$ or less, for example about 5 cm$^2$ or less, such as about 1 cm$^2$ to about 3 cm$^2$. It is contemplated that the width of the line that is in physical contact with the back surface of the substrate may vary depending upon the shape of the substrate support 210. It is also contemplated that the shape and/or dimension of the substrate support 210 may vary so long as the substrate 212 is securely supported with minimized contact area between the substrate support 210 and the back surface 212b of the substrate 212. In one example, the dimensions of the substrate support 210 may vary over broad limits between about 0.1 mm and about 10 mm, such as between about 0.2 mm and about 2 mm, for example about 1 mm in width.

Converting surface contact into continuous line contact substantially reduces the contact area available for conductive transfer of heat between the edge lip 208 of the support ring 200 and the substrate 212, thereby eliminating or minimizing excessive temperature gradients in the substrate during thermal processing even at a reduced pressure of about 3 Torr. Reducing the surface contact area between the substrate 212 and the support ring 200 would also allow for better management of the thermal mass discontinuity caused by the overlap of the substrate 212 and the edge lip 208. Therefore, the distortion of the thermal gradient generated by the heat loss around the edge of the substrate is reduced, resulting in an improved temperature profile of across the substrate with a minimum edge temperature gradient. Reduced contact area between the edge lip 208 and the substrate 212 further reduces possible particle contamination in the processing chamber. For top radiant heating arrangement as shown in FIG. 1, the radiation from the radiation heat source can be tailored just to heat up the substrate without worrying too much about the thermal mass discontinuity in the overlap region since the substrate is thermally disconnected from the edge lip 208 through the substrate supports 210. Therefore, the inventive substrate supports may translate to faster attainable heating ramp rates or reduced spike power situation.

The substrate support 210 may be made of a material that is transparent to radiation in the frequency range used for temperature measurements of the substrate. In one example, the substrate support 210 is made of silicon carbide. Other materials, such as silicon carbide alloys, ceramics, or high temperature materials such as amorphous silica. $Al_2O_3$, $ZrO_2$, $Si_3N_4$, or similar material, are also contemplated. The substrate support 210 may be optionally coated with silicon dioxide ($SiO_2$) or any other suitable material to prevent Si—Si bonding with the back surface 212b of the substrate 212 at high temperatures which can lead to potential substrate sticking to the substrate support. The support ring 200 may be made of a material similar to the substrate so as to minimize absorptivity/reflectance mismatch between the substrate and the support ring. In one example, the support ring 200 is made of silicon carbide. In certain embodiments, the support ring 200 may be optionally coated with a layer of polycrystalline silicon (polysilicon) to render it opaque to radiation in a frequency range used for a temperature measurement of a substrate in a thermal processing chamber. In such a case, the thickness of a polysilicon layer may vary ranging between about 20 µm and about 50 µm, depending upon the thickness of the support ring 200, or depending on opacity of SiC, for example, that is used in the support ring 200.

While the foregoing is directed to embodiments of the disclosure, other and further embodiments may be devised without departing from the basic scope thereof, and the scope thereof is determined by the claims that follow.

The invention claimed is:

1. A substrate support ring, comprising
   a ring body;
   an edge lip that extends radially from a surface of the ring body; and
   a substrate support that extends upwardly from a top surface of the edge lip, wherein the substrate support is a continuous ring-shaped body disposed along a circumference of the edge lip, and the substrate support comprises a substrate contact surface having a radial width of about 5 µm to about 200 µm.

2. The substrate support ring of claim 1, wherein the substrate support has a height of about 0.5 mm to about 3 mm.

3. The substrate support ring of claim 1, wherein the substrate contact surface has a shape selected from the group consisting of hemispherical, rhombus, and triangular.

4. The substrate support ring of claim 1, wherein the radial width is about 50 µm.

5. A substrate support ring, comprising:
   an inner ring;
   an outer ring that connects to an outer perimeter of the inner ring through a flat portion;

an edge lip that extends radially from an inner perimeter of the inner ring to form a supporting ledge; and a substrate support that extends upwardly from a top surface of the supporting ledge, wherein the substrate support is a continuous ring-shaped body disposed around a circumference of the supporting ledge, wherein the substrate support comprises silicon carbide and the substrate support is coated with a layer of silicon dioxide, and the substrate support comprises a substrate contact surface having a radial width of about 5 μm to about 200 μm.

6. The substrate support ring of claim 5, wherein the flat portion extends radially from an inner perimeter of the outer ring to the outer perimeter of the inner ring.

7. The substrate support ring of claim 6, wherein the inner ring has a height of about 0 mm to about 3 mm.

8. The substrate support ring of claim 5, wherein the substrate contact surface has a shape selected from the group consisting of hemispherical, rhombus, and triangular.

9. The substrate support ring of claim 8, wherein the substrate contact surface has a hemispherical shape.

10. The substrate support ring of claim 5, wherein the substrate support has a height of about 0.5 mm to about 3 mm.

11. The substrate support ring of claim 5, wherein the radial width is about 50 μm.

12. A substrate support ring, comprising:

an inner ring;

an outer ring that connects to an outer perimeter of the inner ring through a flat portion;

an edge lip that extends radially from an inner perimeter of the inner ring to form a supporting ledge; and a substrate support that extends upwardly from a top surface of the supporting ledge, wherein the substrate support is a continuous ring-shaped body disposed around a circumference of the supporting ledge, wherein the substrate support comprises silicon carbide and the substrate support is coated with a layer of polycrystalline silicon, and wherein the substrate support provides a substrate contact surface having a radial width of about 5 μm to about 200 μm.

13. The substrate support ring of claim 12, wherein the edge lip has a width of between about 15 mm to about 40 mm.

14. The substrate support ring of claim 13, wherein the edge lip extends radially beneath a substrate to be supported by the substrate support of about 0.5 mm to about 5.0 mm measured from an edge of the edge lip.

15. The substrate support ring of claim 14, wherein the substrate support has a height of about 0.5 mm to about 3 mm.

* * * * *